(12) United States Patent
Wu et al.

(10) Patent No.: US 10,014,445 B2
(45) Date of Patent: Jul. 3, 2018

(54) LIGHT-EMITTING DEVICE AND MANUFACTURING METHOD THEREOF

(71) Applicant: EPISTAR CORPORATION, Hsinchu (TW)

(72) Inventors: Jar-Yu Wu, Hsinchu (TW); Chun-Lung Tseng, Hsinchu (TW); Ching-Hsing Shen, Hsinchu (TW); Wei-Ting Cheng, Hsinchu (TW); Jui-Fen Chien, Hsinchu (TW); Yu-Ming Kung, Hsinchu (TW); Chiao-Yao Cheng, Hsinchu (TW)

(73) Assignee: EPISTAR Corporation, Hsinchu, Taiwan (CN)

( * ) Notice: Subject to any disclaimer, the term of this patent is extended or adjusted under 35 U.S.C. 154(b) by 0 days.

(21) Appl. No.: 15/405,548

(22) Filed: Jan. 13, 2017

(65) Prior Publication Data
US 2017/0200866 A1    Jul. 13, 2017

(30) Foreign Application Priority Data

Jan. 13, 2016   (TW) .............................. 105100979 A

(51) Int. Cl.
| H01L 33/46 | (2010.01) |
| H01L 33/58 | (2010.01) |
| H01L 33/40 | (2010.01) |
| H01L 33/00 | (2010.01) |
| H01L 33/42 | (2010.01) |
| H01L 27/15 | (2006.01) |
| H01L 33/20 | (2010.01) |

(52) U.S. Cl.
CPC .......... *H01L 33/46* (2013.01); *H01L 33/0095* (2013.01); *H01L 33/405* (2013.01); *H01L 33/42* (2013.01); *H01L 33/58* (2013.01); *H01L 27/156* (2013.01); *H01L 33/20* (2013.01); *H01L 2933/0016* (2013.01); *H01L 2933/0025* (2013.01)

(58) Field of Classification Search
CPC ......... H01L 33/46; H01L 33/58; H01L 33/42; H01L 33/0095; H01L 33/405; H01L 2933/0025; H01L 2933/0016
USPC ....................................................... 257/40, 98
See application file for complete search history.

(56) References Cited

U.S. PATENT DOCUMENTS

2012/0256221 A1* 10/2012 Ogawa .................. H01L 33/405
                                                    257/98
2013/0105761 A1*  5/2013 Lim ....................... H01L 33/007
                                                    257/13

* cited by examiner

*Primary Examiner* — Caleen Sullivan
(74) *Attorney, Agent, or Firm* — Juan Carlos A. Marquez; Marquez IP Law Office, PLLC

(57) ABSTRACT

A manufacturing method of a light-emitting device is disclosed. The method includes: providing a semiconductor wafer, including a substrate having a first surface and a second surface opposite to the first surface; and a semiconductor stack on the first surface; removing a portion of the semiconductor stack to form an exposed region; forming a first reflective structure on the exposed region; and providing a radiation on the second surface corresponding to a position of the first reflective structure.

20 Claims, 14 Drawing Sheets

LIGHT-EMITTING DEVICE AND MANUFACTURING METHOD THEREOF

CROSS-REFERENCE TO RELATED APPLICATIONS

This application claims priority to and the benefit of Taiwan Application Number 105100979 filed on Jan. 13, 2016, which is incorporated by reference in its entirety.

BACKGROUND

Technical Field

The present disclosure relates to a light-emitting device and a manufacturing method thereof, more particularly, to a light-emitting device having high brightness.

Description of the Related Art

Light-emitting diode (LED) is an optoelectronic device composed of p-type semiconductor and n-type semiconductor. LEDs emit light by combination of the carriers at p-n junction and can be widely applied in optical display devices, traffic signals, data storage devices, communication devices, lighting devices and medical instruments. Conventional processes of manufacturing LEDs include forming a semiconductor stack on a substrate by epitaxy process so as to form a wafer. After the epitaxy process, a dicing process is performed to divide the wafer into a plurality of light-emitting diode chips.

Conventional wafer dicing methods include forming two groups of scribing lines which are perpendicular to each other on the surface of the LED wafer, and then performing cleaving process by sawing the LED wafer along the two groups of the scribing lines and splitting the wafer into a plurality of LED chips along the scribing lines. Another wafer dicing method includes irradiating laser beam on the surface of the LED wafer. Modification regions are formed on interior of the substrate due to the irradiation of the laser beam and then the LED wafer is separated into a plurality of LED chips along the modification regions by force. However, being limited to the conventional dicing method, the yield of dicing may be degraded when the dicing streets of the LED wafer are narrow or during the process of splitting the LED wafer. Besides, if the power of the laser is not controlled under an optimized condition while performing wafer dicing, in addition to the degraded yield, the laser beam may damage the semiconductor stack of the wafer.

SUMMARY OF THE DISCLOSURE

A method of manufacturing a light-emitting device is disclosed. The method includes: providing a semiconductor wafer, including a substrate having a first surface and a second surface opposite to the first surface; and a semiconductor stack on the first surface; removing a portion of the semiconductor stack to form an exposed region; forming a first reflective structure on the exposed region; and providing a radiation on the second surface corresponding to a position of the first reflective structure.

A light-emitting device is disclosed. The light-emitting device includes: a substrate; a semiconductor stack formed on the substrate, comprising a first semiconductor layer, a second semiconductor layer and an active layer between the first and the second semiconductor layers; a peripheral region surrounding the active layer and the second semiconductor layer; and a first reflective structure formed on the peripheral region.

DETAILED DESCRIPTION OF THE EMBODIMENTS

Figure 1A:
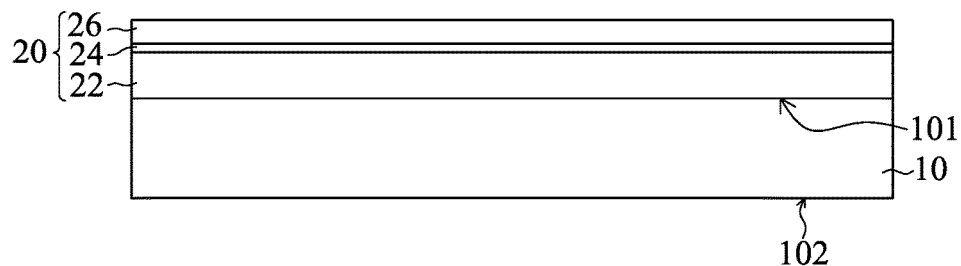
FIGS. 1A-1I show a manufacturing method of a light-emitting device in accordance with one embodiment of present application.

Reference is made in detail to the preferred embodiments of the present application, examples of which are illustrated in the accompanying drawings. Wherever possible, the same reference numbers are used in the drawings and the description to refer to the same or like parts.

FIGS. 1A to 1I show a manufacturing method for light-emitting device in accordance with one embodiment of the present application. As shown in FIG. 1A, a substrate 10 comprising a first surface 101 and a second surface 102 is provided. A semiconductor stack 20 is formed on the first surface 101 by epitaxy process so as to form a wafer 1. The substrate 10 can be sapphire, silicon, SiC, GaN or GaAs. The semiconductor stack 20 comprises a first semiconductor layer 22 and a second semiconductor layer 26 sequentially formed on the first surface 101 and an active layer 24 interposed between the first semiconductor layer 22 and the second semiconductor layer 26. The substrate 10 can be a patterned substrate; i.e. the first surface 101 of the substrate 10 can be patterned. Lights emitted from the active layer 24 can be refracted by the patterned structure of the substrate 10 so that the brightness of the light-emitting device is improved. Furthermore, the patterned structure retards or restrains the dislocation due to lattice mismatch between the substrate 10 and the semiconductor stack 20 so that the epitaxy quality of the semiconductor stack 20 is improved. Besides, a buffer layer (not shown) is formed on the first surface 101 of the substrate 10 before forming the semiconductor stack 20. The buffer layer can also reduce the lattice mismatch described above and restrain the dislocation so as to improve the epitaxy quality. The first semiconductor layer 22 and the second semiconductor layer 26 have different polarities by doping n-type dopant or p-type dopant. For example, the first semiconductor layer 22 is an n-type semiconductor and the second semiconductor layer 26 is a p-type semiconductor. The material of the semiconductor stack 20 comprises III-V compound semiconductor comprising one element selected from the groups composed of Al, Ga, In, N, P, As and Si, such as a compound semiconductor like AlGaInP, AlN, GaN, AlGaN, InGaN or AlInGaN. The structure of the active layer 24 can be single heterostructure (SH), double heterostructure (DH), double-side heterostructure (DDH) or multi-quantum well (MQW) structure.

Figure 1B:
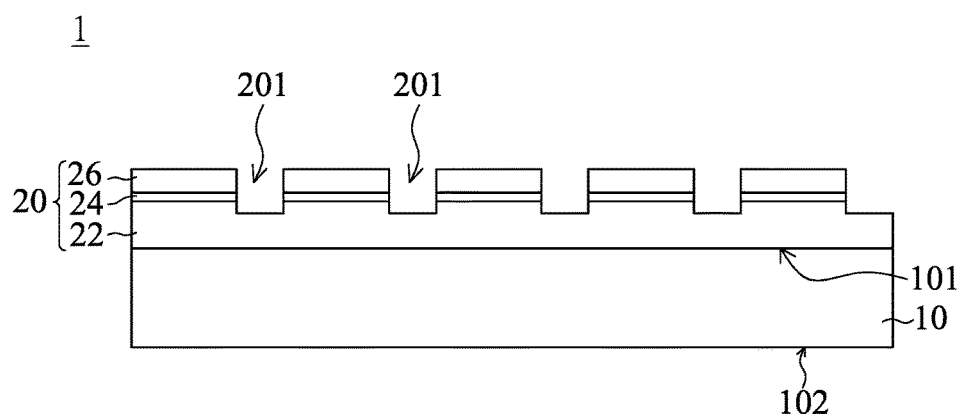
Figure 1C:
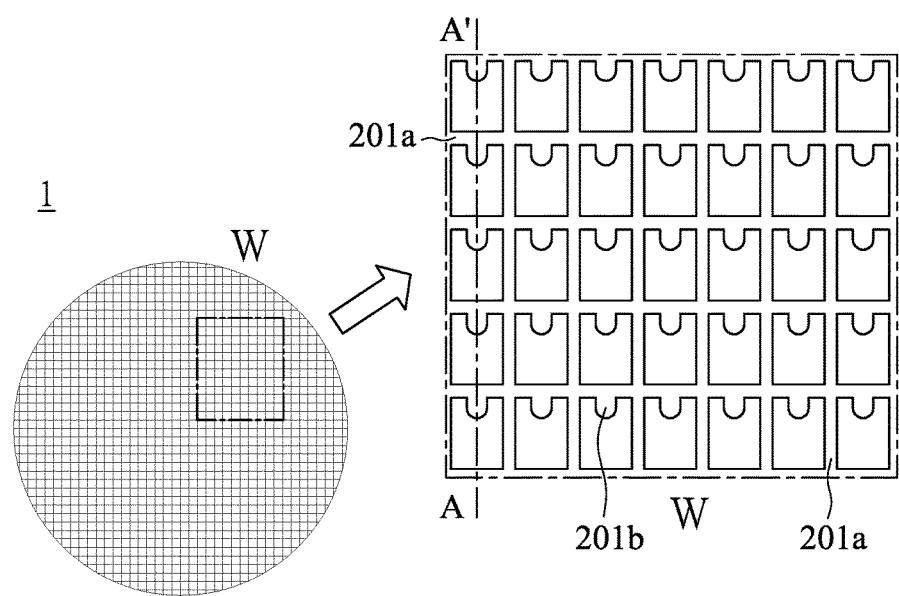
Figure 1D:
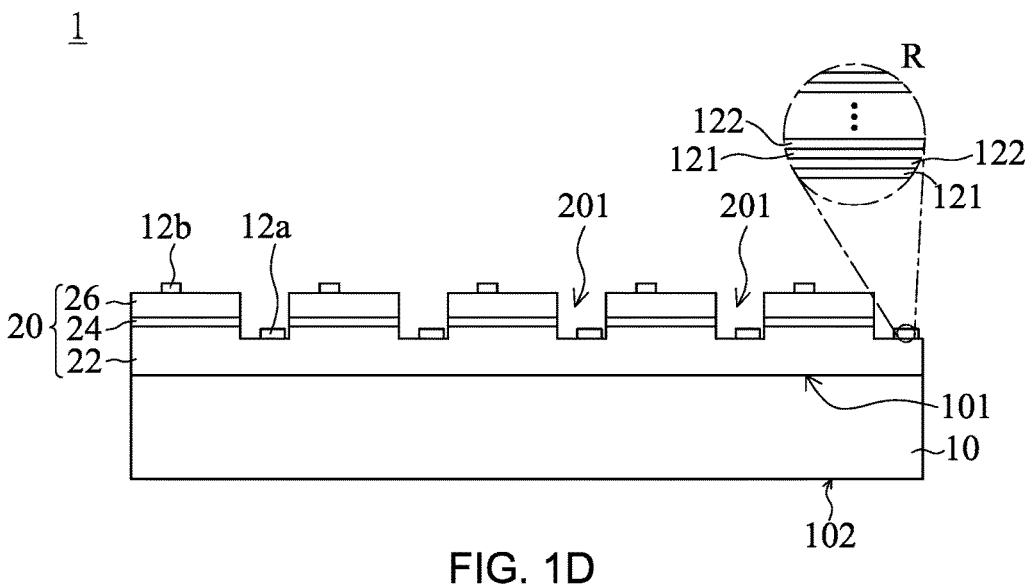

Next, as shown in FIG. 1B and FIG. 1C, a part of the second semiconductor layer 26 and the active layer 24 are removed to expose the first semiconductor layer 22 by etching process. An exposed region 201 is formed accordingly. FIG. 1B is a cross-sectional view along line A-A' of an enlarged region W in FIG. 1C. The exposed region 201 comprises a plurality of first exposed regions 201a perpendicular with each other and a plurality of second exposed regions 201b. In the following process, the second exposed regions 201b are used to form electrodes thereon. The first exposed regions 201a function as the dicing streets in wafer dicing process. The wafer 1 is diced along the dicing streets formed by the first exposed regions 201a. Then, as shown in FIG. 1D, a first reflective structure 12a is formed on a surface of the first exposed region 201a and a second reflective structure 12b is formed on the second semiconductor layer 26. The first reflective structure 12a and the second reflective structure 12b are formed in the same process and have the same material. The region R is an enlarged view of the first reflective structure 12a and the second reflective structure 12b in FIG. 1D. As shown in FIG. 1D, the first reflective structure 12a and the second reflective structure 12b have stacks of dielectric material. The stack of dielectric material comprises a plurality of pairs of dielectric layer 121 and 122 with different refractive indexes alternately laminated. The dielectric material comprises SiOx, $Si_3N_4$, $Al_2O_3$, $Ti_xO_y$, $Ta_2O_5$, $Nb_2O_5$, $ZrO_2$ or a combination thereof.

Figure 1E:
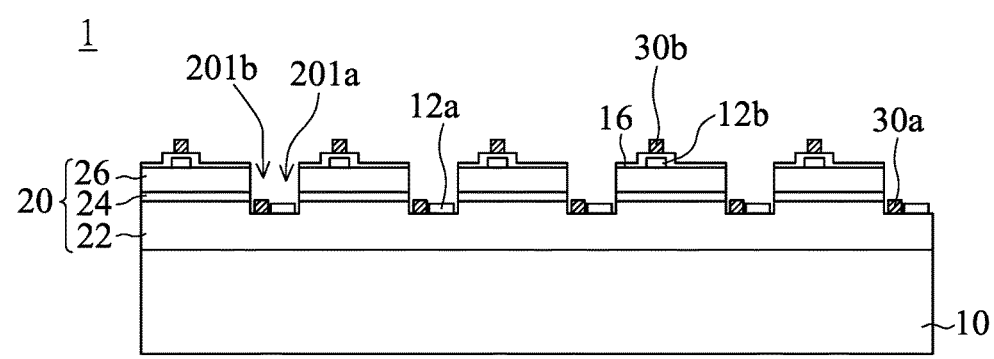
Figure 1F:
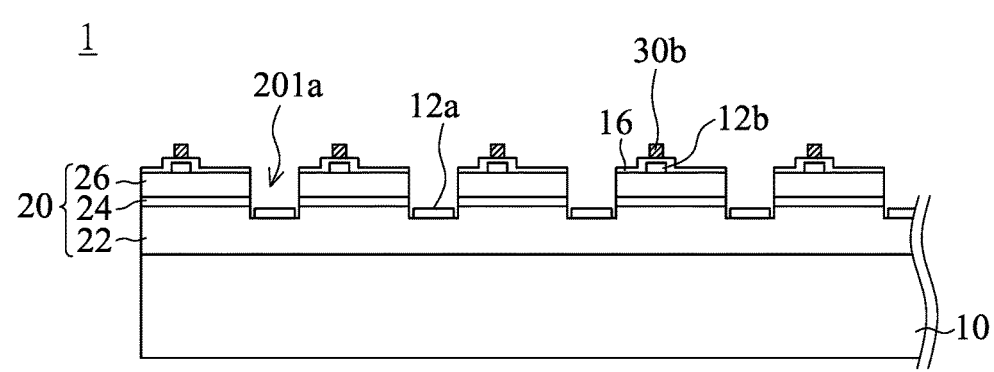
Figure 1G:
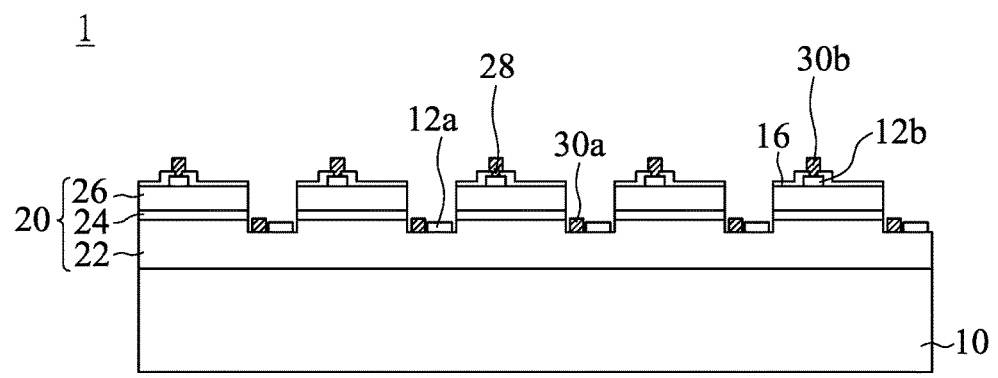

Then, referring to FIG. 1E, a transparent conductive layer 16 is formed on the second semiconductor layer 26 and the second reflective structure 12b. The transparent conductive layer 16 can covers entirely the second reflective structure 12b. Next, a first electrode 30a is formed on a surface of the first semiconductor layer 22 in the second exposed region 201b, and a second electrode 30b is formed on the transparent conductive layer 16. The second electrode 30b is formed on a position corresponding to the second reflective structure 12b. An area of the second electrode 30b is equal to or smaller than that of the second reflective structure 12b. The first electrode 30a and the second electrode 30c are disposed oppositely on the semiconductor stack 20 and respectively near the shorter edges of the semiconductor stack 20. FIG. 1F shows a cross-sectional view along a direction perpendicular to the line A-A' in FIG. 1C which passes the second electrode 30b. In another embodiment as shown in FIG. 1G, the structure is similar with that in FIG. 1E. The difference between the structures in FIG. 1E and FIG. 1G is that the transparent conductive layer 16 has an opening 28 at a position corresponding to the second reflective structure 12b so that parts of the top surface of the second reflective structure 12b are exposed. In a cross-sectional view, a width of the opening 28 is smaller than a width of the second reflective electrode 12b and/or the maximum width of the second electrode 30b. The second electrode 30b is formed on the transparent conductive layer 16 and the second reflective structure 12b and fills in the opening 28 to contact the second reflective structure 12b. In another embodiment of the present application, both the second reflective structure 12b and the transparent conductive layer 16 have openings under the second electrode 30b. In a cross-sectional view, a width of the opening is slightly smaller than the maximum width of the second electrode 30b so that the second electrode 30b passes the second reflective structure 12a and the transparent conductive layer 16 via the opening and contacts the second semiconductor layer 26.

Figure 1H:
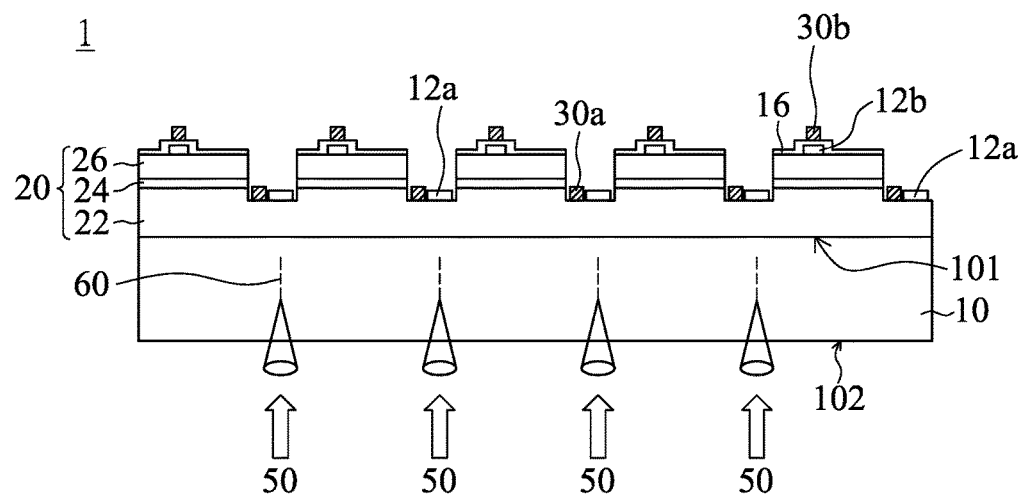
Figure 1I:
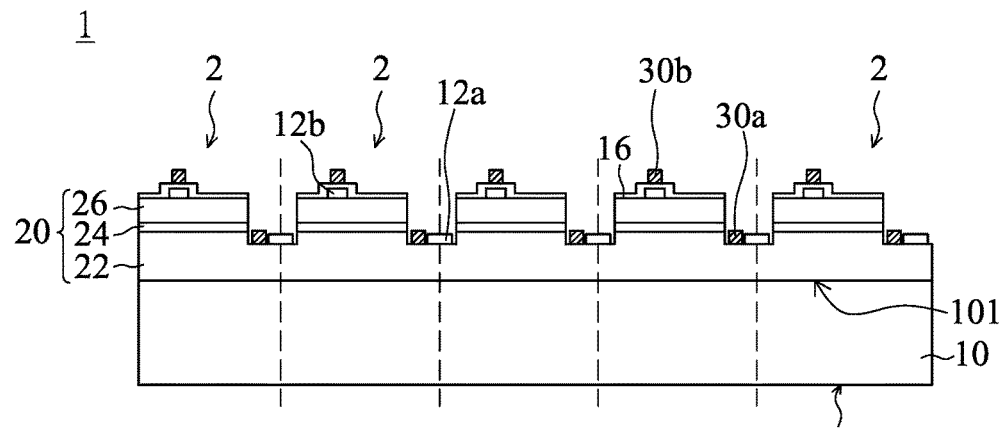
Figure 2:
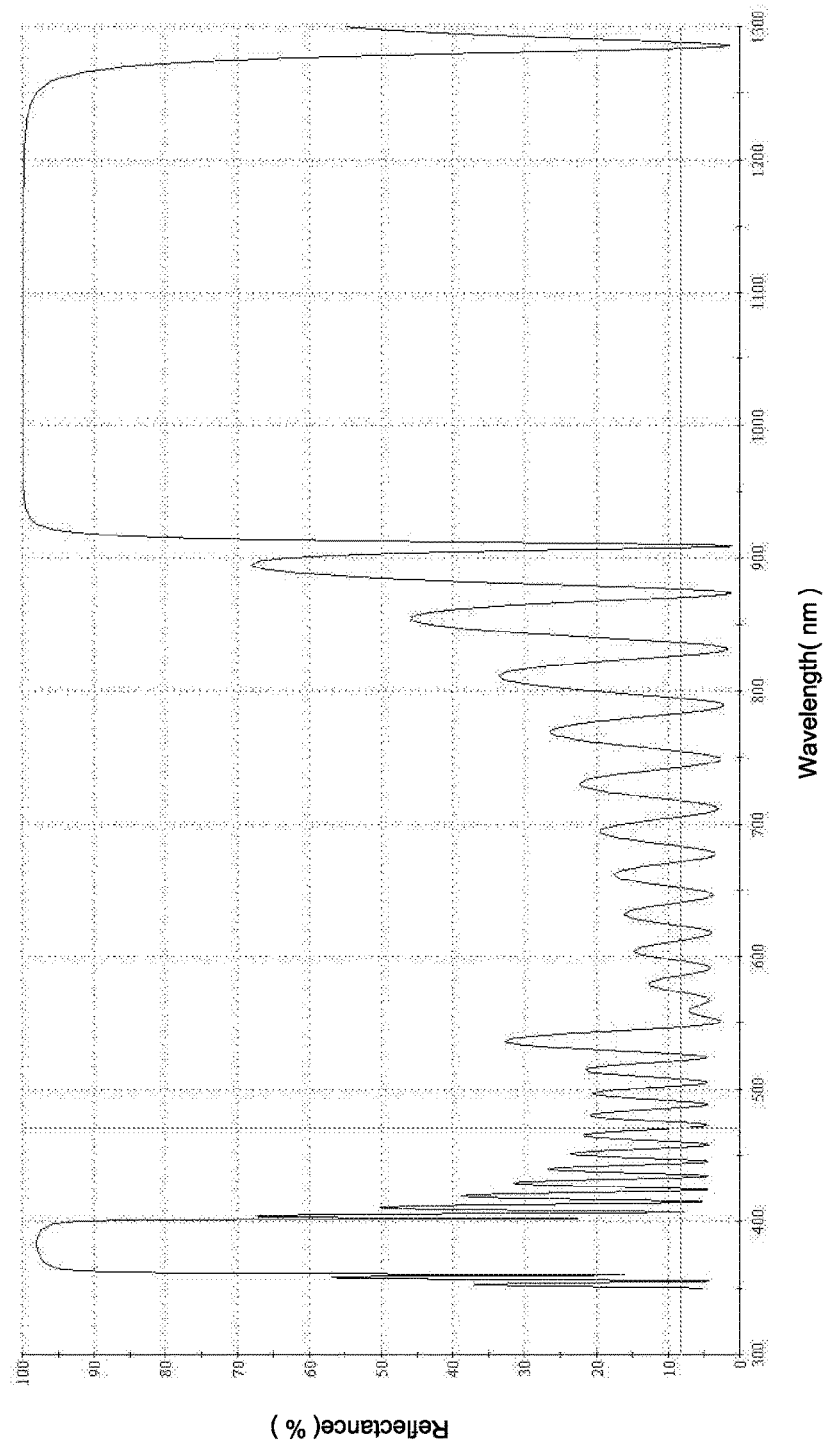
FIG. 2 shows a diagram demonstrating the reflectivity vs. wavelength of the light-emitting device.

Next, as shown in FIG. 1H, providing a radiation, for example, a laser 50 on the second surface 102 of the substrate 10 along a path corresponding to the dicing streets formed by the first exposed region 201a. The laser 50 can be stealth dicing laser (SD laser). The laser focuses on the interior of the substrate 10 along the dicing streets and forms modification region 60 in the interior of the substrate 10. The modification region 60 becomes stealth dicing lines. In one embodiment, the stealth dicing laser can be repeatedly performed and focus on the interior of the substrate with different depths to form several stealth dicing lines on the same cross section inside the substrate 10. In another embodiment, before applying the laser dicing, a reflective layer (e.g. distributed Bragg reflector, DBR) is formed on the second surface 102 of the substrate 10 to improve light extraction of the light-emitting device. While the stealth dicing laser is focused on the interior of the substrate 10, parts of the laser 50 may pass through the first surface 101 of the substrate 10 and scatter into the semiconductor stack 20. As a result, the semiconductor stack 20 is damaged. By selecting the dielectric material, the thickness and the number of the dielectric layers, the first reflective structure 12a can reflect and guide the laser 50 which passes through the substrate 10 away from the semiconductor stack 20. Thus, the laser 50 which scatters into the semiconductor stack 20 is reflected by the first reflective structure 12a and the damage of the semiconductor stack 20 caused by the laser 50 can be prevented and/or reduced. For example, when the wavelength of the applied stealth dicing laser 50 is about 1064 nm, the first reflective structure 12a can be a stack comprising 12 pairs of $SiO_2$ layer with thickness of 183 nm and $TiO_2$ layer with thickness of 112 nm alternately laminated. Referring to the simulation result shown in FIG. 2, when applying the stealth dicing laser with a wavelength of 1064 nm, the first reflective structure 12a with the stack described above almost reflects the laser at this wavelength entirely. Finally, a force is applied on the front side or back side of the wafer 1. Thus, the wafer 1 is split along the stealth dicing lines inside the substrate 10 and the first reflective structure 12a is also separated accordingly. Then, the wafer 1 is separated into a plurality of light-emitting device 2.

Figure 3A:
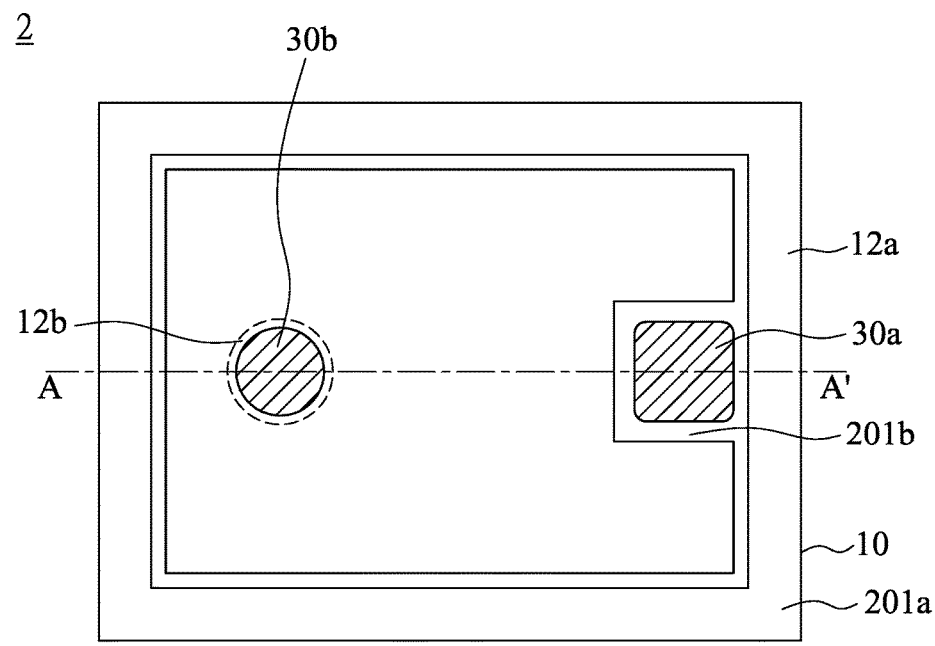
FIGS. 3A and 3B respectively show a top view and a cross-sectional view of a light-emitting device in accordance with another embodiment of present application.
Figure 3B:
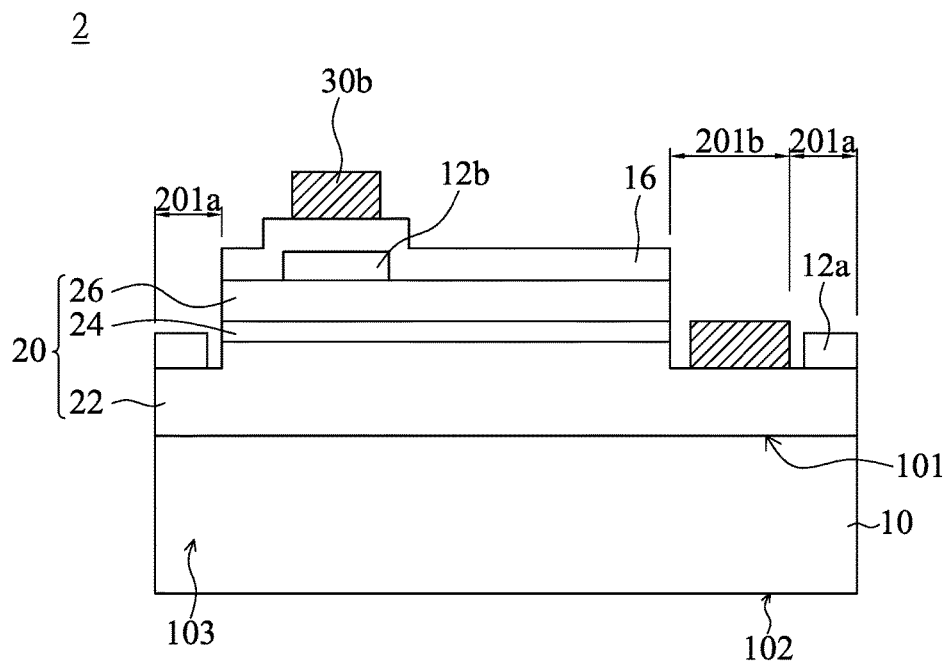

FIG. 3A shows a top view of a light-emitting device 2 according to the manufacturing method described above in the present application. FIG. 3B is a cross-sectional view along line A-A' in FIG. 3A. The light-emitting device 2 comprises a substrate 10 having a first surface 101, a second surface 102, a plurality of side surfaces 103, and a semiconductor stack 20 formed on the first surface 101 of the substrate 10. The first surface 101 of the substrate 10 may comprise a patterned structure (not shown) which can enhance the brightness and epitaxy quality of the light-emitting device 2. The semiconductor stack 20 comprises a first semiconductor layer 22, a second semiconductor layer 26, and an active layer 24 between the first semiconductor layer 22 and the second semiconductor layer 26. The semiconductor stack 20 comprises a first exposed region 201a and a second exposed region 201b which expose the first semiconductor layer 22 by removing a portion of the second semiconductor layer 26 and the active layer 24. A first reflective structure 12a is formed on the first exposed region 201a and a first electrode 30a is formed on the second exposed region 201b. As described in the aforementioned manufacturing method of the light-emitting device, since the first reflective structure 12a is disposed on the dicing street formed by the first exposed region 201a before dicing the wafer, when viewing from a top, the first reflective structure 12a surrounds the active layer 24 and the second semiconductor layer 26. There is no first reflective structure 12a between a sidewall of the active layer 24 and adjacent first electrode 30a or between a sidewall of the second semiconductor layer 26 and adjacent first electrode 30a. A second reflective structure 12b and a transparent conductive layer 16 covering the second reflective structure 12b and the second semiconductor layer 26 are formed on the second semiconductor layer 26. A second electrode 30b is formed on the transparent conductive layer 16 at a position corresponding to the second reflective structure 12b. The area of the second reflective structure 12b can be equal to or slightly larger than the area of the second electrode 30b, and the second reflective structure 12b and the second electrode 30b may have the same or similar shape. In the manufacturing method of the present application, since the wafer 1 has modification regions in the substrate 10 formed by the stealth dicing laser and the wafer 1 is cleaved into the plurality of light-emitting device 2 by an external force along the modification regions, the side surfaces 103 of the split substrate 10 have a textured region (not shown) that is substantially parallel to the first surface 101 and/or the second surface 102; wherein the textured region has stripe pattern. That is, the striped textured regions are the modification regions caused by the laser beam focusing on the interior of the substrate 10. When the stealth laser dicing is performed repeatedly, a plurality of stripe textured regions is formed. In addition, the light-emitting device 2 may have a reflective layer (not shown) on the second surface 102 of the substrate 10 to enhance the light extraction efficiency.

Since the first reflective structure 12a and the second reflective structure 12b are formed at the same time in the same process, the first reflective structure 12a and the second reflective structure 12b have the same material. The first and second reflective structures 12a and 12b comprise dielectric stacks composed of a plurality of pairs of dielectric materials with different refractive indexes alternately laminated. The dielectric materials comprise SiOx, $Si_3N_4$, $Al_2O_3$, $Ti_xO_y$, $Ta_2O_5$, $Nb_2O_5$, $ZrO_2$, or a combination thereof. In one embodiment, the first reflective structure 12a and the second reflective structure 12b are stacks of $SiO_2$ layers and $TiO_2$ layers alternately laminated, and the stack comprises 2 to 12 pairs of $SiO_2$ layer and $TiO_2$ layer. Since the second reflective structure 12b is formed between the second semiconductor layer 26 and the transparent conductive layer 16 at a position corresponding to the second electrode 30b and with a shape corresponding to the second electrode 30b, the second reflective structure 12b made by the dielectric material prohibits current from directly injecting into the second semiconductor layer 26 from the second electrode 30b. Then, electron-hole recombination under the second electrode 30b is reduced. Therefore, the light-emitting efficiency of the region other than the second electrode 30b can be improved.

Figure 4A:
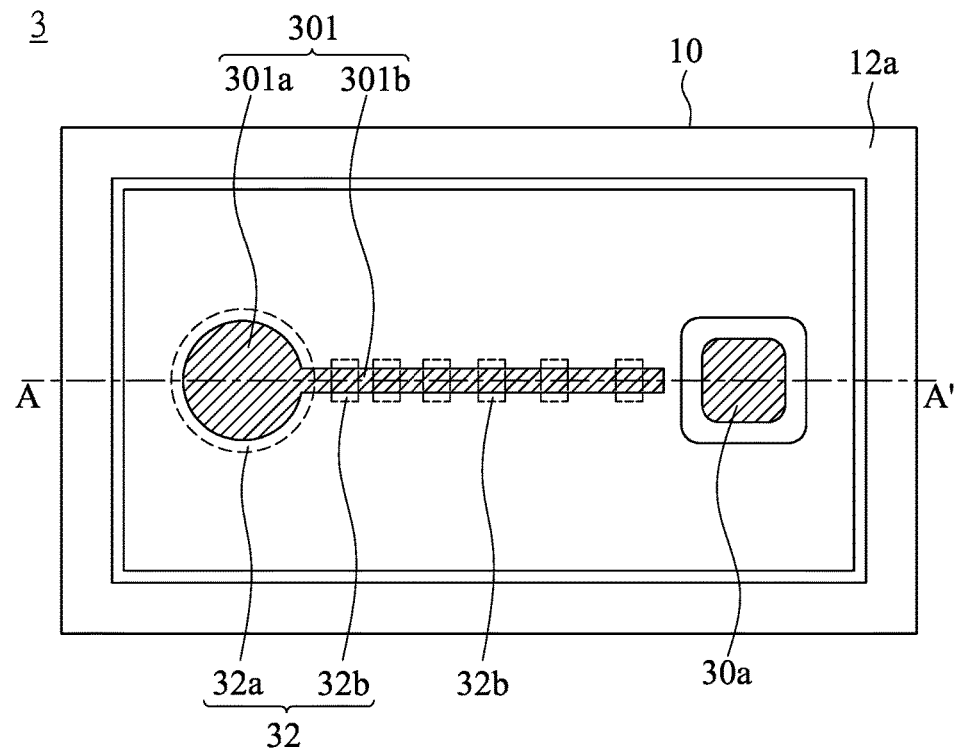
FIGS. 4A and 4B respectively show a top view and a cross-sectional view of a light-emitting device in accordance with another embodiment of present application.
Figure 4B:
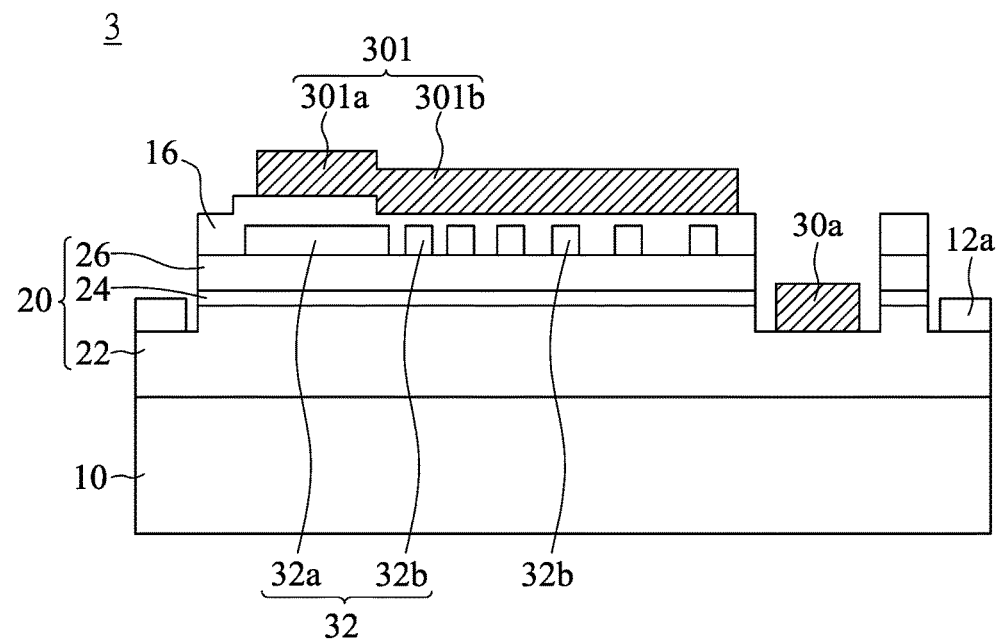
Figure 5A:
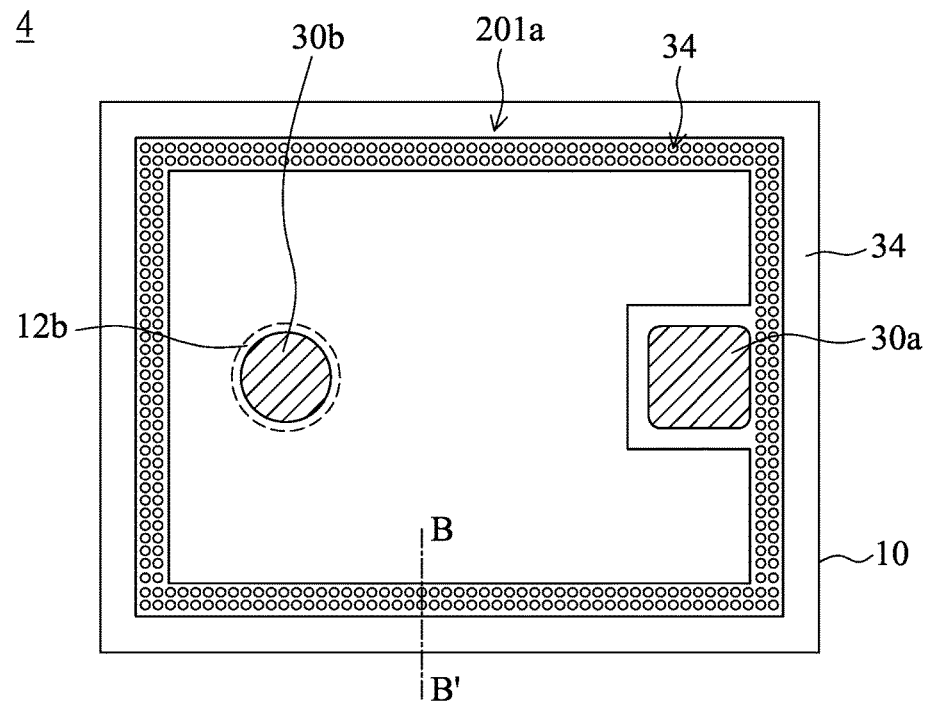
FIGS. 5A and 5B respectively show a top view and a cross-sectional view of a light-emitting device in accordance with another embodiment of present application.
Figure 5B:
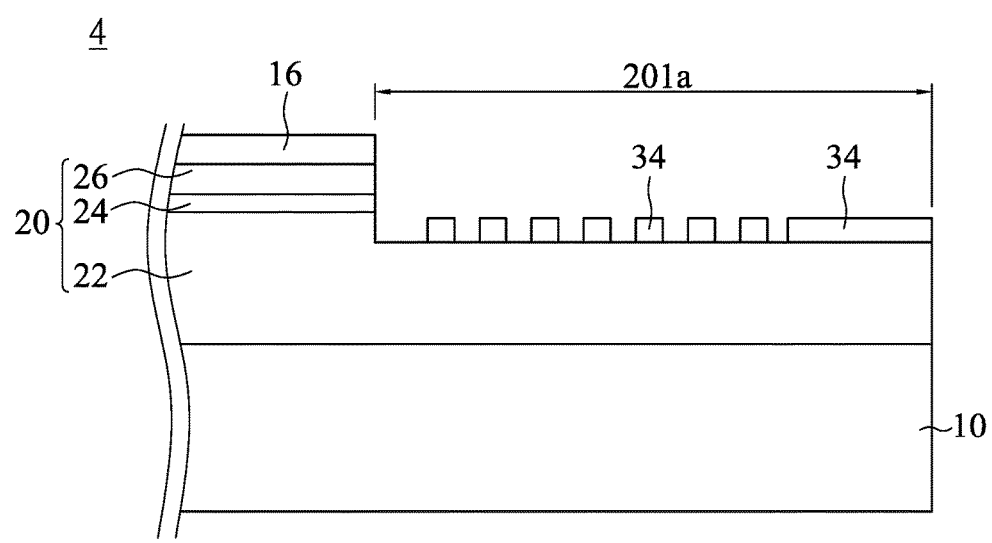

In a light-emitting device 3 in accordance with another embodiment of the present application, a patterned first reflective structure can be formed on the first semiconductor layer 22 in the first exposed region 201a around the light-emitting device 3 and/or a patterned second reflective structure can be formed on the second semiconductor layer 26. FIGS. 4A and 4B show an example of such structure. FIG. 4B is a cross-sectional view taken along the line A-A' of FIG. 4A. The second electrode 301 includes a bonding portion 301a and an extending portion 301b extending from the bonding portion 301a. A plurality of patterned second reflective structures 32 are provided on the second semiconductor layer 26 and under the second electrode 301. The second reflective structures 32a are located under the bonding portion 301a and the plurality of patterned second reflective structures 32b is located under the extensions 301b. The plurality of patterned second reflective structures 32b can be composed of a plurality of discontinuous dots, blocks or line structures. The gap between the plurality of patterned second reflective structures 32b increases as the distance from the bonding portion 301a increases. That is, as the plurality of patterned second reflective structures 32b is more far away from the bonding portion 301a, the intervals among the plurality of patterned second reflective structures 32b become wider. In a light-emitting device 4 in accordance with another embodiment of the present application shown in FIG. 5A, a patterned first reflective structure 34 is formed on the first exposed region 201a. FIG. 5B is a cross-sectional view taken along the line B-B' in FIG. 5A. The patterned first reflective structures 34 formed by dielectric materials scatter light emitted by the light-emitting device 4 around the light-emitting device 4 thereby enhance light-extraction efficiency of the light-emitting device 4. The arrangements of the first and the second reflective structures of the light-emitting device in accordance with the present application are not limited thereto and may comprise different arrangements depending on the purpose of current confinement or light-extraction.

Figure 6A:
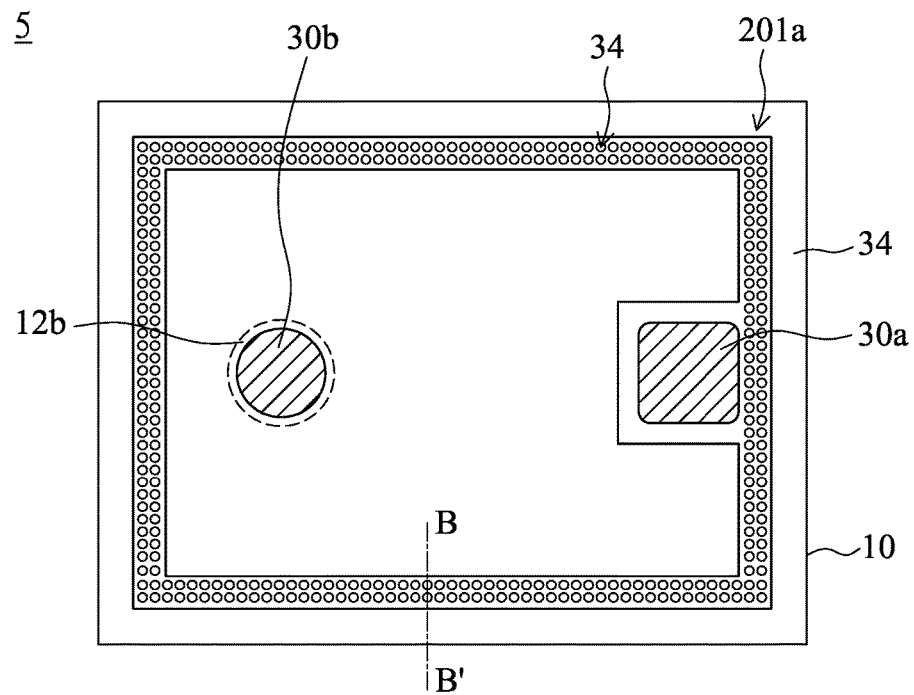
FIGS. 6A and 6B respectively show a top view and a cross-sectional view of a light-emitting device in accordance with another embodiment of present application.
Figure 6B:
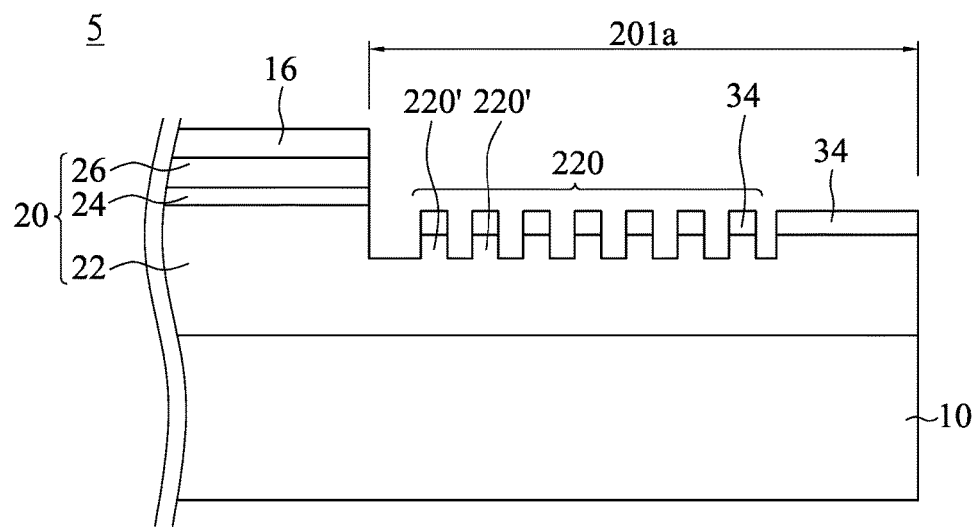

FIGS. 6A and 6B are a top view and a cross-sectional view taken along line B-B' of a light-emitting device 5 in accordance with another embodiment of the present application, respectively. The surface of the first semiconductor layer 22 of the first exposed region 201a around the light-emitting device 5 has a light guide structure 220 and a first reflective structure 34 formed thereon. The light guide structure 220 is composed of a plurality of pillars 220' with a height between 1 μm and 10 μm. The light guide structure 220 is formed by etching the first semiconductor layer 22 in the first exposed region 201a by using the patterned first reflective structure 34 as a mask after patterning the first reflective structure 34. For example, the etching process can be dry etching and the etching depth can be 1 μm to 10 μm. As a result, a portion of the first semiconductor layer 22 not covered by the patterned first reflective structure 34 is removed, and the plurality of pillars 220' are formed on the surface of the first semiconductor layer 22. The light-emitting efficiency of the light-emitting device 5 is improved by the patterned first reflective structures 34 and the light guide structures 220 on the first exposed region 201a around the light-emitting device 5.

Figure 7A:
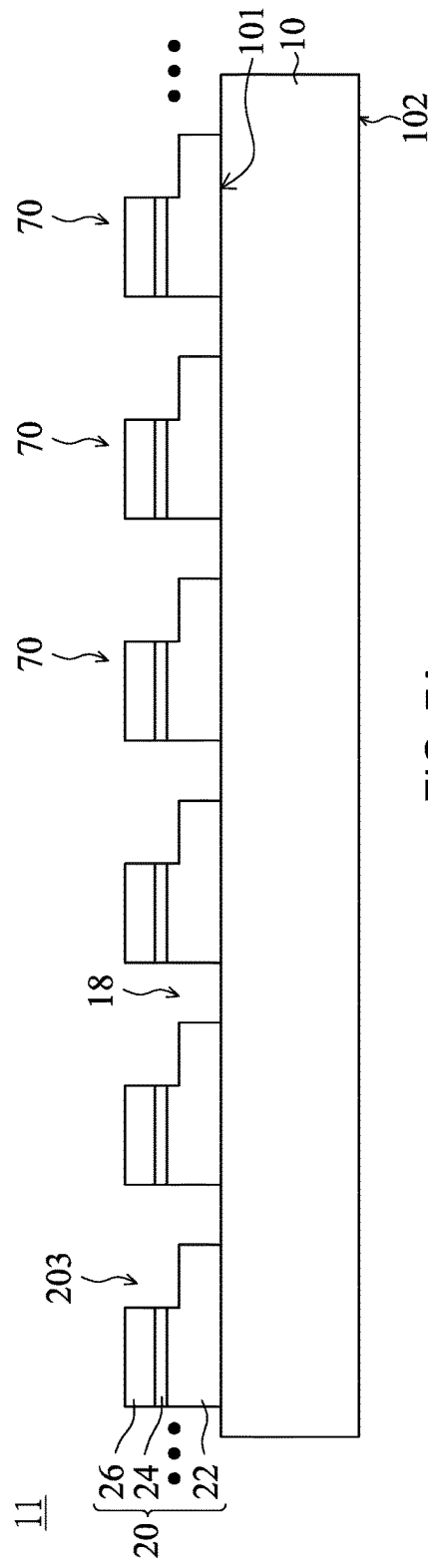
FIGS. 7A-7F show a manufacturing method of a light-emitting device in accordance with another embodiment of present application.
Figure 7B:
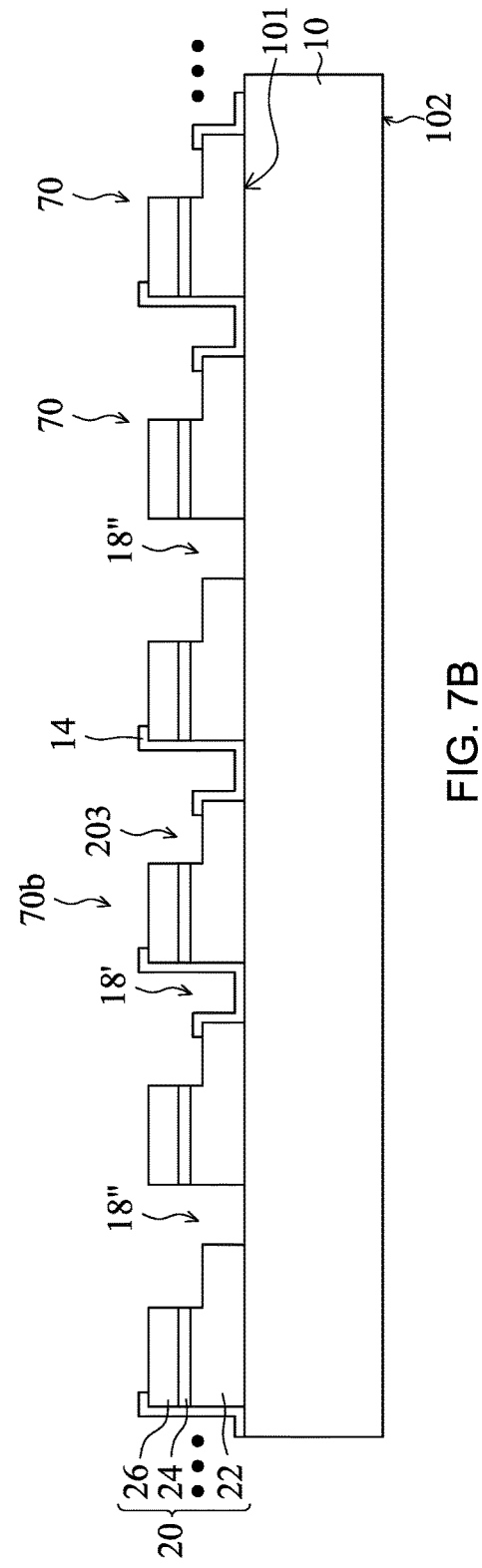
Figure 7C:
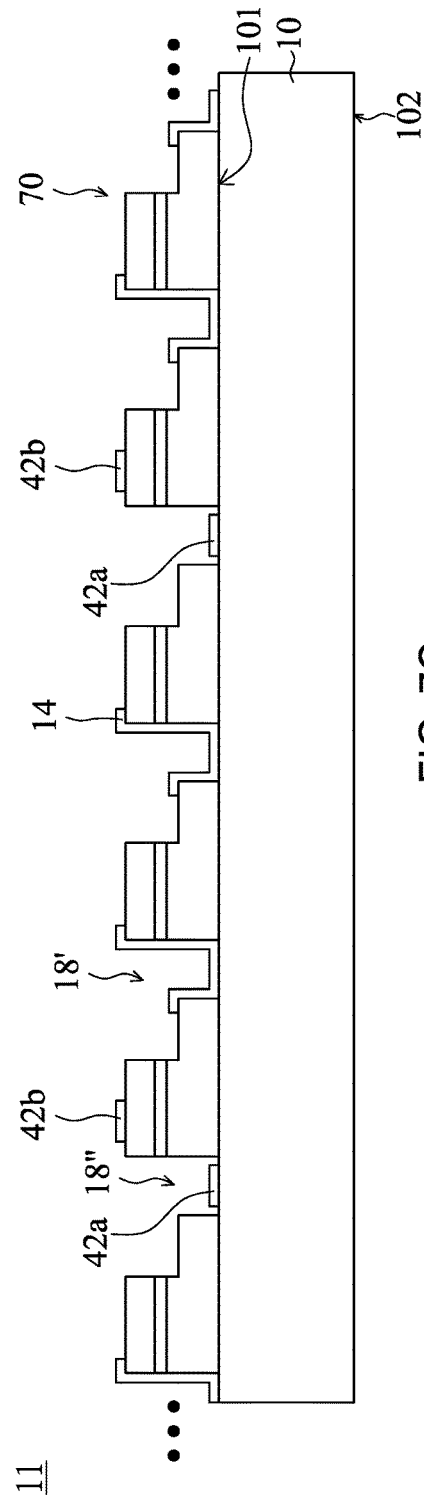

FIGS. 7A to 7F show a manufacturing method of a light-emitting device in accordance with another embodiment in the present application. As shown in FIG. 7A, after the semiconductor stack 20 is epitaxially grown on the first surface 101 of the substrate 10, the wafer 11 is formed. Parts of the second semiconductor layer 26 and the active layer 24 are removed by etching process and the first semiconductor layer 22 is exposed to form a plurality of platforms 203. In another embodiment, the first surface 101 of the substrate 10 may have a patterned structure (not shown). Next, a portion of the first semiconductor layer 22 in the platforms 203 is further removed by etching to expose the first surface 101 of the substrate 10 so that a plurality of trenches 18 is formed. A plurality of light-emitting cells 70 is separated from each other by trenches 18. Next, as shown in FIG. 7B, the trenches 18 include isolation regions 18' where an insulating layer 14 is on a portion of the trenches 18 and an exposed region 18" where no insulating layer 14 is provided between two adjacent light-emitting cells 70. The insulating layer 14 in the isolation region 18' covers the sidewall of the adjacent light-emitting units 70, the first semiconductor layer 22, and the second semiconductor layer 26. In subsequent processes, the exposed regions 18" are used to define dicing streets in the wafer dicing process. The wafer 11 is diced along the dicing streets. Next, as shown in FIG. 7C, a first reflective structure 42a is formed on the first surface 101 in the exposed region 18", and a second reflective structure 42b is formed on the second semiconductor layer 26 of parts of the light-emitting cells 70. The first and second reflective structures 42a and 42b are formed simultaneously and made by the same material. The first reflective structure 42a and the second reflective structure 42b are dielectric stacks composed of a plurality of pairs of dielectric layers with different refractive indexes alternately laminated. The dielectric materials comprise SiOx, $Si_3N_4$, $Al_2O_3$, $Ti_xO_y$, $Ta_2O_5$, $Nb_2O_5$, $ZrO_2$, or a combination thereof.

Figure 7D:
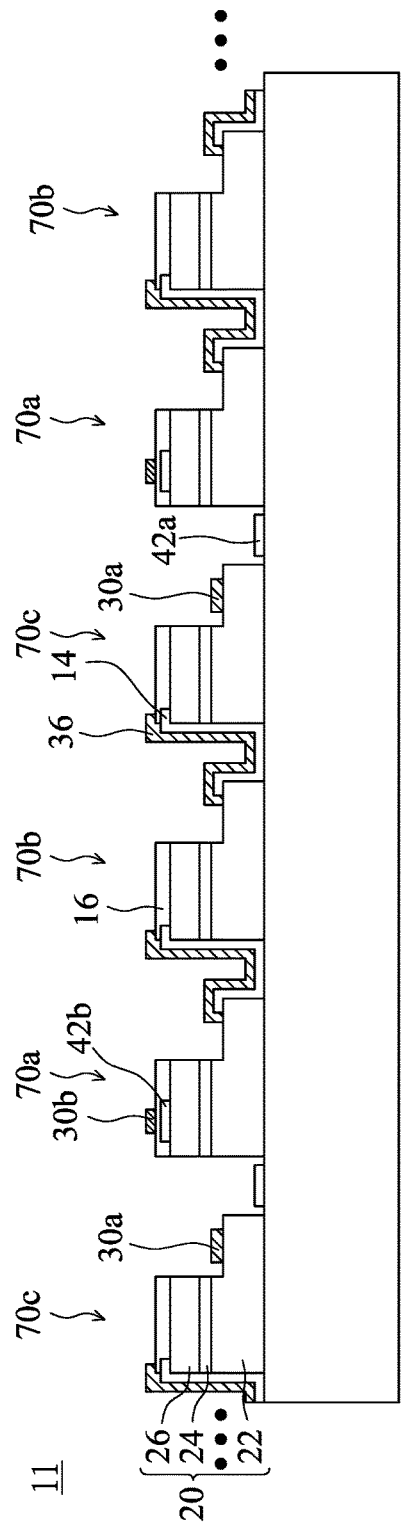

Then, as shown in FIG. 7D, a transparent conductive layer 16 is formed on the surface of the second semiconductor layer 26 and the second reflective structure 42b of each light-emitting cell 70. The transparent conductive layer 16 can cover the second reflective structure 42b entirely. Next, an electrical connection 36 is formed on the insulating layer 14, a first electrode 30a is formed on the first semiconductor layer of the light-emitting cell 70c, and second electrode 30b is formed on the transparent conductive layer 16 at a position corresponding to the second reflective structure 42b of the light-emitting cell 70a. The electrical connection 36 covers the insulating layer 14 and extends onto the first semiconductor layer 22 and the transparent conductive layer 16 of the adjacent light-emitting cells so that the light-emitting cells 70a to 70c are electrically connected in series. The first electrode 30a and the second electrode 30b can be connected to an external power supply or an electronic component by wiring or bonding. As a result, the light-emitting cells 70a-70c are defined as a light-emitting array. The second electrode 30b is formed on a corresponding position of the second reflective structure 42b, and the area of the second electrode 30b can be equal to or slightly smaller than that of the second reflective structure 42b. In another embodiment of the present application, the transparent conductive layer 16 and the second reflective structure 42b have openings (not shown) at the position corresponding to the second electrode 30b so as to expose a portion of the upper surface of the second semiconductor layer 26. The second electrode 30b is formed on the transparent conductive layer 16 and the second reflective structure 42b, and fills in the opening to contact the second semiconductor layer 26.

Figure 7E:
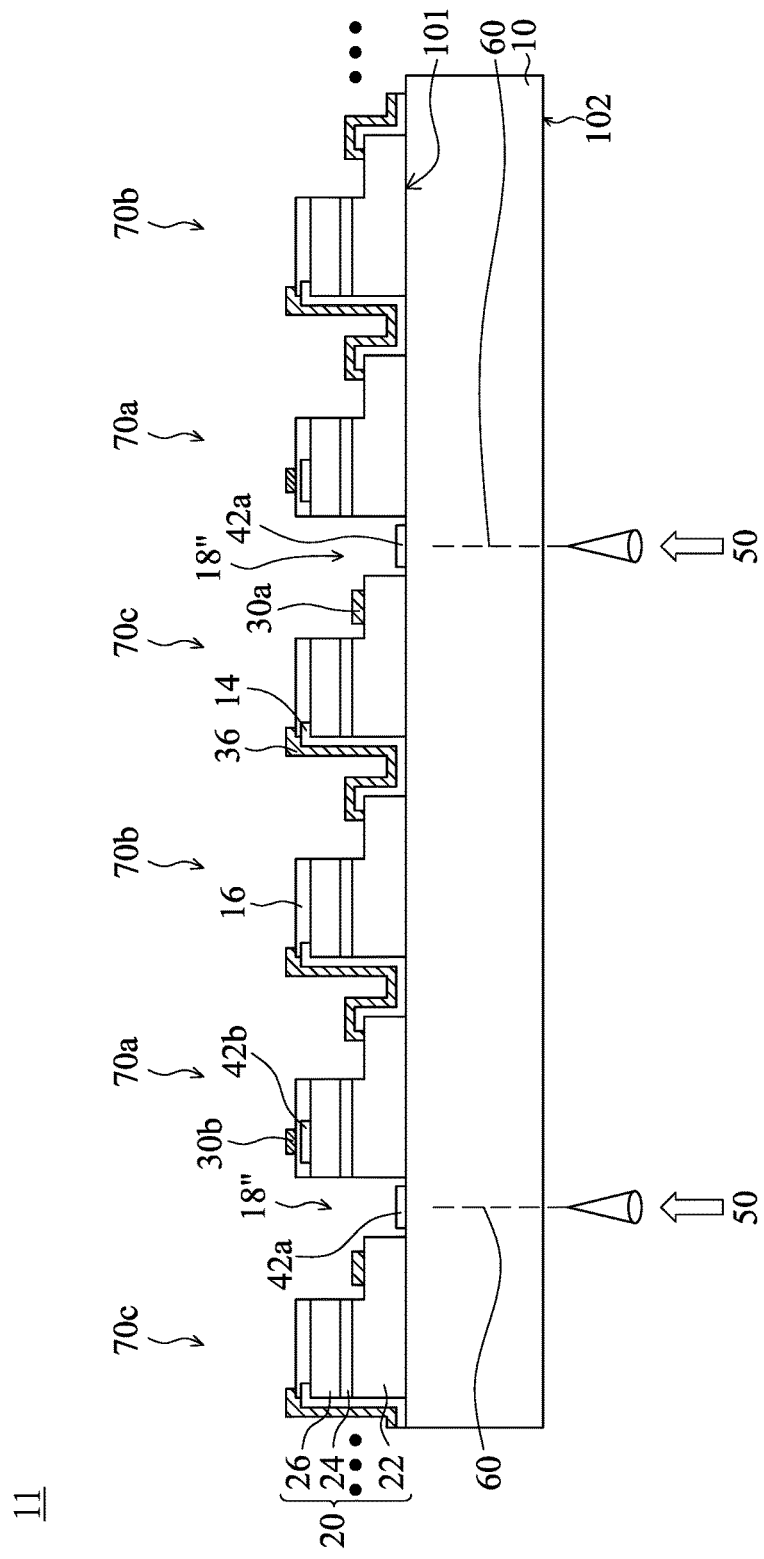
Figure 7F:
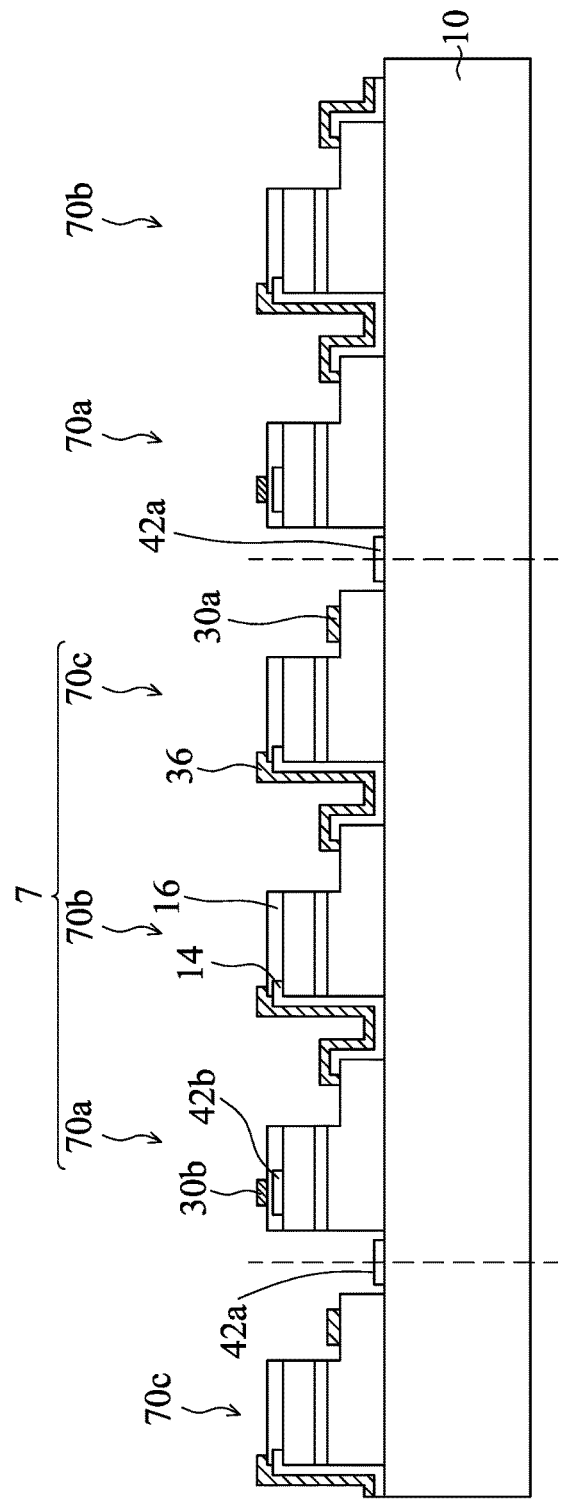

Next, as shown in FIG. 7E, the second surface 102 of the substrate 10 is irradiated by a radiation, for example, the laser 50 on a position corresponding to the dicing streets formed by the exposed region 18". The laser 50 can be a stealth dicing laser. The laser 50 focuses on the interior of the substrate 10 along the dicing streets and then the modification regions 60 (i.e. stealth dicing lines) are formed. In another embodiment, a reflective layer (not shown) can be formed on the second surface of the substrate 10 prior to performing stealth dicing laser to improve light-extraction efficiency of the light-emitting device. When the stealth dicing laser focusing on the interior of the substrate 10, a portion of the laser 50 may scatter into the semiconductor stack through the first surface 101 of the substrate 10 thereby damage the semiconductor stack 20. By selecting suitable dielectric material, the thickness and the number of the dielectric layers of the first reflective structure 42a, the first reflective structure 42a is able to reflect and guide the laser 50 which passes through the substrate 10 away from the semiconductor stack 20. Thus, the laser 50 which scatters into the semiconductor stack 20 is reflected by the first reflective structure 42a, and the damage in the semiconductor stack 20 caused by the power of the laser 50 can be prevented and reduced. Finally, as shown in FIG. 7F, force is applied to the wafer 11 to split the wafer 11 along the stealth dicing lines inside the substrate 10, and the first reflective structure 42a is also split. The wafer 11 is separated into a plurality of light-emitting device 7. Each light-emitting device 7 includes a light-emitting array having light-emitting cells 70a to 70c connected in series.

Figure 8A:
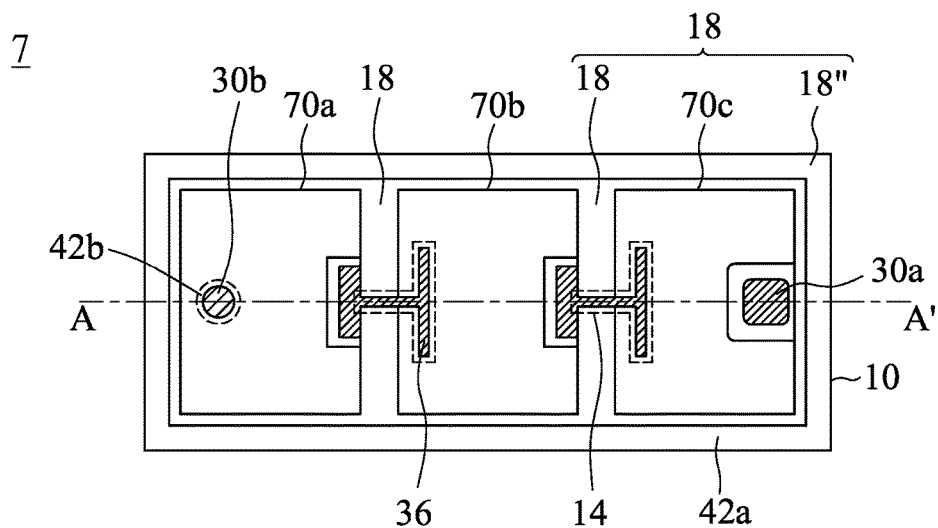
FIGS. 8A and 8B respectively show a top view and a cross-sectional view of a light-emitting device in accordance with another embodiment of present application.
Figure 8B:
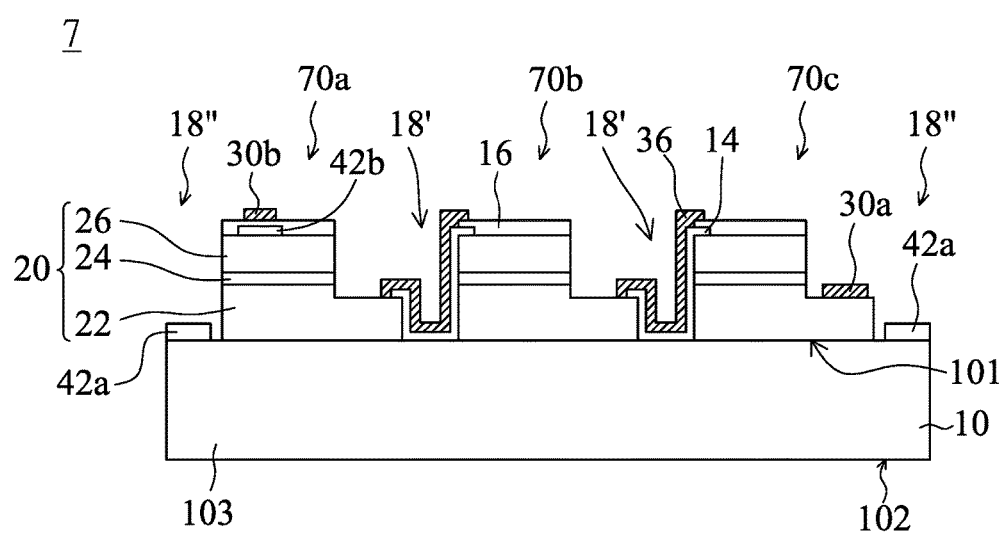

FIG. 8A is a top view of the light-emitting device 7 in accordance with the manufacturing method of the present application, and FIG. 8B is a cross-sectional view taken along the line A-A' in FIG. 8A. The light-emitting device 7 comprises a substrate 10 having a first surface 101, a second surface 102, a plurality of side surfaces 103, and light-emitting cells 70a-70c disposed on the first surface 101 of the substrate 10. Each light-emitting cell includes a light-emitting stack 20, and the light-emitting cells 70a-70c are spatially separated from each other by the trenches 18. The bottom of the trench 18 is the first surface 101 of the substrate 10. The first surface 101 within the trench 18 and the sidewalls of the adjacent light-emitting cells 70 have an insulating layer 14 disposed thereon to form an isolation region 18'. The electrical connection 36 is on the insulating layer 14. The electrical connection 36 covers the insulating layer 14 and contacts the first semiconductor layer 22 and the transparent conductive layer 16 of the adjacent light-emitting cells to electrically connect the light-emitting cells 70a to 70c in series. The second reflective structure 42b and the transparent conductive layer 16 covering the second reflective structure 42b and the second semiconductor layer 26 is formed on the surface of the second semiconductor layer 26 of the light-emitting cell 70a. The second electrode 30b is disposed on the transparent conductive layer 16 at a position corresponding to the second reflective structure 42b. The first reflecting structure 42a is provided on the first surface 101 of the substrate 10 as in the aforementioned manufacturing method of the light-emitting device. Since the first reflecting structure 42a is provided on the dicing street formed by the exposed region 18" before dicing the wafer 11, the first reflective structure 42a simultaneously surrounds the first semiconductor layer 22, the active layer 24, and the second semiconductor layer 26 of the light-emitting cells 70a to 70b in a top view. Since the first reflective structure 42a and the second reflective structure 42b are formed at the same time, the first reflective structure 42a and the second reflective structure 42b have the same material and comprise dielectric stacks composed by a plurality of pairs of dielectric materials having different refractive indexes alternately laminated. In another embodiment, the structure of the light-emitting device is similar to that of the light-emitting device 7, and the difference is that the insulating layer 14 can be formed in the same process as the first reflecting structure 42a and the second reflecting structure 42b, and the material of the insulating layer 14 can be the same as that of the first reflective structure 42a and the second reflective structure 42b. The insulating layer 14 can be a reflective structure with a dielectric stack composed of a plurality of pairs of dielectric materials having different refractive indexes alternately laminated.

Figure 9A:
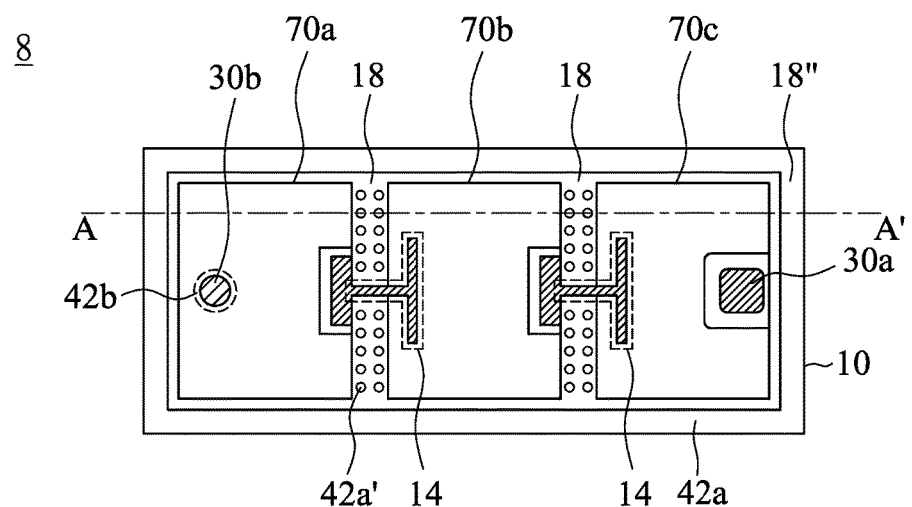
FIGS. 9A and 9B respectively show a top view and a cross-sectional view of a light-emitting device in accordance with a further embodiment of present application.
Figure 9B:
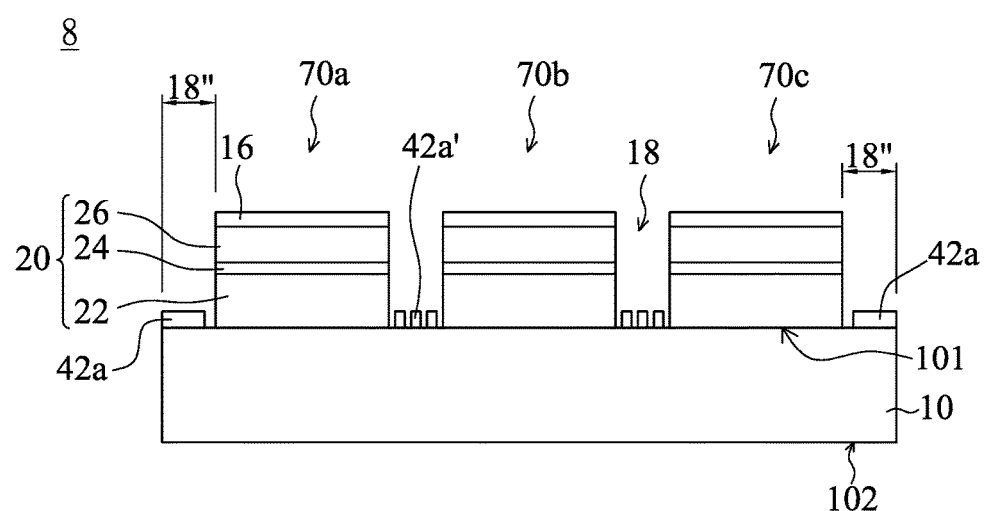

In the light-emitting device 8 in accordance with another embodiment of the present application, the patterned first reflective structure 42a' can be provided between the adjacent light-emitting cells 70a to 70c. The structure and material of the patterned first reflective structure 42a' can be the same as the reflective structure described above or similarly modified based on the disclosure. As shown in FIGS. 9A and 9B which is a cross-sectional view taken along the line A-A' of FIG. 9A, the patterned first reflective structure 42a' is provided on the first surface 101 in the isolation region 18'. The patterned first reflective structure 42a' composed of dielectric material has a function of light guiding. Therefore, the lateral light emitted from the light-emitting cells 70a to 70c is prevented from being absorbed by each other due to the close distance between each light-emitting cell that degrades the light-emitting efficiency.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a substrate;
a light-emitting stack on the substrate, comprising:
a first semiconductor layer;
a second semiconductor layer; and
an active layer formed between the first semiconductor layer and the second semiconductor layer;
a peripheral region surrounding the active layer and the second semiconductor layer; and
a first reflective structure formed on the peripheral region and surrounding the active layer.

2. The light-emitting device of claim 1, further comprising:
a second electrode on the second semiconductor layer; and
a second reflective structure disposed between the second electrode and the second semiconductor layer;
wherein the first reflective structure and the second reflective structure have the same dielectric stacks, and the dielectric stacks are formed by a plurality of pairs of dielectric layers having different refractive indexes alternately laminated.

3. The light-emitting device of claim 2, wherein the second reflective structure comprises a patterned structure.

4. The light-emitting device of claim 1, wherein the first reflective structure comprises a dielectric stack, and the dielectric stack is formed by a plurality of dielectric layers with different refractive indexes alternately laminated.

5. The light-emitting device of claim 1, wherein the first reflective structure is capable of reflecting the radiation.

6. The light-emitting device of claim 1, wherein the peripheral region comprises an exposed surface of the first semiconductor layer, and the first reflective structure is formed on the exposed surface of the first semiconductor layer.

7. The light-emitting device of claim 6, wherein the first reflective structure comprises a patterned structure.

8. The light-emitting device of claim 7, wherein the surface of the first semiconductor layer in the peripheral region comprises light guiding structures.

9. The light-emitting device of claim 1, further comprising:
one or more light-emitting stacks on the substrate to form a plurality of the light-emitting stacks;
wherein the peripheral region comprises an exposed surface of the substrate at a peripheral of the substrate where the light-emitting stack are not provided thereon, and the peripheral region surrounds the first semiconductor layers, the active layers, and the second semiconductor layers of the plurality of the light-emitting stacks; and
the first reflective structure is formed on the exposed surface of the substrate.

10. The light-emitting device of claim 9, wherein the first reflective structure has a patterned structure and/or the first reflective structure is formed between any two light-emitting stacks of the plurality of light-emitting stacks.

11. A light-emitting device, comprising:
a substrate;
a light-emitting stack on the substrate, comprising:
a first semiconductor layer;
a second semiconductor layer; and
an active layer formed between the first semiconductor layer and the second semiconductor layer;
a peripheral region surrounding the light-emitting stack and comprising an exposed surface of the substrate; and
a first reflective structure formed directly on the exposed surface of the substrate where the light-emitting stack is not formed thereon.

12. The light-emitting device of claim 11, further comprising:
a second electrode on the second semiconductor layer; and
a second reflective structure disposed between the second electrode and the second semiconductor layer;
wherein the first reflective structure and the second reflective structure have the same dielectric stacks, and the dielectric stacks are formed by a plurality of pairs of dielectric layers having different refractive indexes alternately laminated.

13. The light-emitting device of claim 12, wherein the second reflective structure comprises a patterned structure.

14. The light-emitting device of claim 11, wherein the first reflective structure comprises a dielectric stack, and the dielectric stack is formed by a plurality of dielectric layers with different refractive indexes alternately laminated.

15. The light-emitting device of claim 11, wherein the first reflective structure is capable of reflecting the radiation.

16. The light-emitting device of claim 11, wherein the first reflective structure surrounds the light-emitting stack.

17. The light-emitting device of claim 11, further comprising:
one or more light-emitting stacks on the substrate to form a plurality of the light-emitting stacks; wherein the first reflective structure comprises a patterned structure and/or the first reflective structure is formed between two of the light-emitting stacks.

18. The light-emitting device of claim 17, wherein two of the light-emitting stacks where the first reflective structure is formed between are electrically serially connected by an electrical connection.

19. The light-emitting device of claim 18, wherein the first reflective structure is under the electrical connection.

20. The light-emitting device of claim 11, wherein the first reflective structure comprises a patterned structure.

* * * * *